United States Patent [19]

Deguchi et al.

[11] Patent Number: 4,653,895
[45] Date of Patent: Mar. 31, 1987

[54] PRINTER HEAD

[75] Inventors: Yutaka Deguchi; Yasuyuki Tsuchida, both of Hyogo, Japan

[73] Assignee: Sanyo Electric Co., Ltd., Japan

[21] Appl. No.: 806,088

[22] Filed: Dec. 6, 1985

[30] Foreign Application Priority Data

Dec. 13, 1984 [JP] Japan .................. 59-263184

[51] Int. Cl.$^4$ ............................................ G08G 15/00
[52] U.S. Cl. ........................................ 355/1; 355/3 R; 346/107 R; 350/96.1; 350/96.24
[58] Field of Search ..................... 355/3 R, 1, 14 D; 346/107 R, 108; 350/96.1, 96.24

[56] References Cited

U.S. PATENT DOCUMENTS

| | | | |
|---|---|---|---|
| 3,988,742 | 10/1976 | Meier et al. | 346/107 R |
| 4,008,954 | 2/1977 | Ogawa | 355/1 |
| 4,364,064 | 12/1982 | Baues | 346/107 R |
| 4,376,282 | 3/1983 | Kotani et al. | 346/107 R |
| 4,435,064 | 3/1984 | Tsukada et al. | 355/1 |

Primary Examiner—A. C. Prescott
Attorney, Agent, or Firm—Darby & Darby

[57] ABSTRACT

A printer head comprises a plurality of light emitting portions (104) on one side of a rectangular substrate (101), the portions (104) being aligned in parallel with a longitudinal direction of the substrate, and two driver circuit units (112, 113) on the other side of the substrate (101) such that the respective input/output terminals of the units (112, 113) are aligned in a direction orthogonal to the aligning direction of the light emitting portions (104). Each of lead electrodes (106) of the light emitting portions (104) is connected to one of output terminals of first and second driver circuit units (112, 113) from one of first conductive strip lines (108) through a resistor (111), and the input terminals of the first and second driver circuits (112, 113) are connected to external connecting terminals (118). A common electrode (107) for the light emitting portions (104) is connected to a second conductive path (110), the second conductive path (110) branching near the central portion of the substrate (101) so that the path (110) can be connected to the external connection terminals (118) passing through the underside of the first and second driving circuit units (112, 113). Thus structured printer head enables its arrangement in a narrow space of an electrophotographic copying machine, for example.

16 Claims, 16 Drawing Figures

FIG. 4A
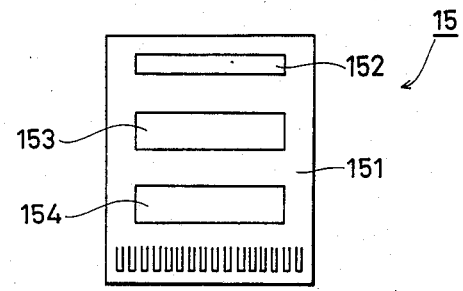
FIG. 4B
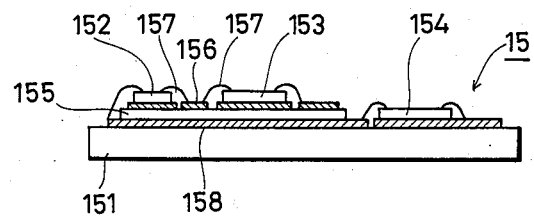
FIG. 5A  FIG. 5B
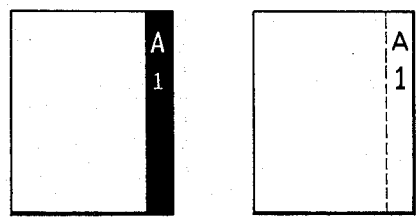
FIG. 5C  FIG. 5D  FIG. 5E
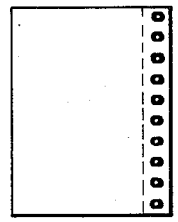 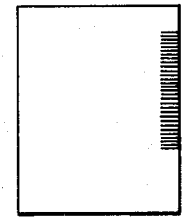 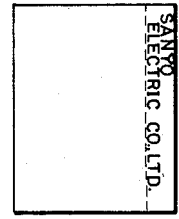

PRINTER HEAD

BACKGROUND OF THE INVENTION

1. Field of the Invention

The present invention relates to a printer head. More particularly, the present invention relates to a printer head for use in a serial type of light emitting diode printer, a light source for partial printing in a copying machine, and the like.

2. Description of the Prior Art

Recently, there has been proposed a light emitting diode printer wherein the printer head receives an electric signal obtained by scanning and reading a document or manuscript by means of photoelectric transducer, or an electric signal obtained by an external machine such as a computer and emits a light, so that the emitted light is applied to a photosensitive element through an optical system and a printing is made by means of electrostatic photographing process. An electrophotographic copying machine containing a light emitting diode printer as a light source for partial printing is known in the Japanese Patent Laying-Open Gazette No. 131564/1985. In the following, the electrophotographic copying machine will be described by way of example.

FIG. 1 is a perspective view of an electrophotographic copying machine. Referring to FIG. 1, a document carriage 2, which is movable in the right and left directions, is slidably mounted in an upper surface of a copying machine body 1. Copy sheets are contained in a copy sheet feeding cassette 3 and the copy sheets as already copied are contained in a discharging tray 4. There are provided in a manipulating panel 5 a ten-key 6 for designating the number of copying sheets, and selection keys 7 for selecting an image other than a document image (for example, date and/or company name). There is also a display panel 8, in which 7-segment displaying elements (not shown) for displaying the number of copying sheets and 7-segment displaying elements (not shown) for displaying a number indicating a content of the designated printing.

FIG. 2 is a cross sectional view showing an internal mechanism of the electrophotographic copying machine shown in FIG. 1. Referring to FIG. 2, the document carriage 2 as described with reference to FIG. 1 comprises a transparent glass plate mounted movably in the right and left direction on the upper surface of the copying machine body 1, and a cover 12 which can be opened and closed is mounted on the upper surface of the document carriage 2. A photosensitive drum 13 having a coating of an amorphous silicon photosensitive element on the peripheral side surface thereof is rotatably mounted near the central portion of the copying machine body 1. There is perpendicularly provided over the top of the photosensitive drum 13 a short focusing lens series 14 for focusing an image of the document on the document carriage 2 into the peripheral side surface of the photosensitive drum 13.

There is provided over a portion of the short focusing lens series 14 a printer head 15 comprising a monolithic light emitting diode array (referred to as LED array hereinafter) for forming on the photosensitive drum 13 an electrostatic latent other than the image of the document. Detailed structure of the printer head 15 will be described subsequently. In addition, there is also provided on the opposite side of the short focusing lens series 14 with respect to the rotational direction of the photosensitive drum 13 an electrification corotron 16 for uniformly electrifying the photosensitive drum 13 to a positive potential (about 600 V). Over the electrification corotron 16, an exposure lamp (halogen lamp) 17 for illuminating the surface of the document is provided and a filter 18 is provided in the front of the exposure lamp 17.

As a result of the above described structure, an electrostatic latent of the document is formed on a major portion of the surface of the photosensitive drum 13 by the electrification corotron 16, the exposure lamp 17, the short focusing lens series 14 and the document and an electrostatic latent other than the image of the document is formed on a portion of the surface of the photosensitive drum 13 by the printer head 15.

On the side of rotational directions of the photosensitive drum 13 with respect to the short focusing lens series 14, a developing apparatus 19 for developing an electrostatic latent by a toner is provided. The developing apparatus 19 contains mixture (developer) 20 of toner and carrier, the developer 20 being fed toward the photosensitive drum 13 by a magnet roller 21 while being electrified to negative potential. At that time, bristles of the developer 20 are formed on a portion of the magnet roller 21 opposed to the photosensitive drum 13, so that the top of the bristles contacts with the photosensitive drum 13 and hence the toner which is electrified to the negative potential is applied to the electrostatic latent formed by the positive charges, whereby the image of the document and the image other than the document image are developed. The height of the bristles is controlled by a blade 22.

The copy sheet cassette 3 containing copy sheets 11 therein in a stacked manner is detachably mounted in the right of the copying machine body 1. A supporting plate 23 for supporting copy sheets 11 is provided in a swinging manner in the bottom of the cassette 3 and there is provided under the supporting plate 23 an opening 25 to which a free end of a force lever 24 can be inserted, the base end of the lever 24 being mounted in a swinging manner in the bottom portion inside of the copying machine body 1.

A spring (not shown) for rotation-biasing the force lever 24 in a clockwise direction is provided in the fore lever 24 and the supporting plate 23 is biased upwardly by the spring. A sheet feeding roller 26 for feeding a copy sheet 11 one by one is provided over one side of the sheet feeding cassette 3. The copy sheet 11 on the uppermost position is contacted against the underside of the sheet feeding roller 26 by said force lever 24.

There is provided between the sheet feeding roller 26 and the photosensitive drum 13 a pair of register rollers 27, 27 for re-feeding a copy sheet 11 in synchronization with operation of the document carriage 2 after the copy sheet 11 fed from the cassette 3 is once stopped. Presence or absence of the copy sheet 11 is detected by a reflection type of photosensor 28.

A transferring corotron 29 for transferring a toner image developed by the developing apparatus 19 to the copy sheet 11 is provided under the photosensitive drum 13. In addition, a stripping corotron 30 for stripping off the copy sheet 11 from the photosensitive drum 13 is disposed adjacent to the transferring corotron 29 in the downstream of the feeding direction of copy sheet 11.

A vacuum conveyer 31 for feeding the copy sheet 11 having a toner image as transferred is provided in a further downstream of the feeding direction of the copy sheet 11 with respect to the stripping corotron 30, and the copying sheet 11 having a toner image as transferred is fed toward a fixing apparatus 32 by the vacuum conveyer 31. The fixing apparatus 32 comprises a heat roller 34 including a heater 33 and a pressure roller 35 pressure-contacted by the heat roller 34, so that the copy sheet 11 having a toner applied thereto is pressed, heated and hence fixed by being inserted between both of the rollers 34 and 35. An offset preventing claw 36 is provided for preventing the copy sheet 11 as fixed from being offset by the heat roller 34. A pair of outputting rollers 37, 37 for discharging the fixed copy sheet 11 are provided in a further downstream of the feeding direction of the copy sheet 11 with respect to the heat roller 34. A detecting switch 38 for detecting the copy sheet 11 is provided on the discharging side of the sheet discharging roller pair 37, 37.

A cleaning apparatus 39 for eliminating toner which is left on the photosensitive drum 13 without being transferred to the copy sheet 11 is provided over the vacuum conveyer 31. The cleaning apparatus 39 comprises a cleaning blade 40 for taking off the remaining toner on the photosensitive drum 13 and a roller 42 for feeding the toner taken off by the cleaning blade 40 to a toner housing box 41.

After a desired key out of the selection keys 7 on the manipulating panel 5 is depressed and a document is set on the document carriage 2, the document is scanned by light exposure, upon depression of a start button 43. More particularly, after the document carriage 2 is once moved to the right, the carriage 2 is moved to the left, and when the carriage 2 is moved to the left, the document set on the carriage 2 is exposed by light and scanned, and then the image of the document is focused on the photosensitive drum 13 by the short focusing lens series 14, so that an electrostatic latent corresponding to the document image can be formed. At that time, the printer head 15 selectively emits light and the electrostatic latent of the content (for example, date) corresponding to the manipulated selection key is simultaneously formed on the photosensitive drum 13.

Thus formed electrostatic latents of the document and messages or the like as selected by the selection key are developed by toner by the developing apparatus 19. Then, the toner image is transferred to the copy sheet 11 fed by the pair of register rollers 27, 27 by the transferring corotron 29. The copy sheet 11 having the transferred toner image is taken off from the photosensitive drum 13 by the stripping corotron 30, and then the copy sheet 11 is fed to the fixing apparatus 32 by the vacuum conveyer 31, where a fixing is made by the heat roller 34 and pressure roller 35. The copy sheet 11 as fixed is discharged onto the sheet discharging tray 4 by the sheet discharging roller pair 37, 37.

Meanwhile, the toner left on the photosensitive drum 13 without being transferred to the copy sheet 11 is cleaned by the cleaning apparatus 39, and the cleaned photosensitive drum 13 is uniformly electrified to new positive potential by the electrification corotron 16.

FIG. 3 is a perspective view, partially in cross section, showing a short focusing lens series and a printer head contained in an electronic copying machine, FIG. 4A is a plan view of a conventional printer head, FIG. 4B is a cross sectional view of the conventional printer head and FIGS. 5A to 5D are plan views showing a copy sheet having images other than a document image formed therein.

Now, a printer head will be described. The printer head 15 is held by a holder 44 and is mounted in one end of the short focusing lens series 14 so as to span the series 14.

As shown in FIGS. 4A and 4B, the printer head 15 is provided with a light emitting array 152 comprising a plurality of light emitting portions aligned on an alumina insulating substrate 151 having a small sized rectangular configuration. In order to drive the light emitting array 152, first and second driver integrated circuits 153 and 154 are disposed on the insulating substrate 151. The first driver integrated circuit 153 drives the light emitting portions located in orders in odd numbers counted from one end of the alignment of the light emitting portions and the second driver integrated circuit 154 drives the light emitting portions located in orders in even numbers counted from one end of the alignment of the light emitting portions. An aligning direction of the light emitting portions in the light emitting array 152 and an ranging direction of connection terminals of the first and second driver integrated circuits 153 and 154 are substantially parallel with a traverse direction of the substrate 151, and the light emitting array 152 and the first and second driver integrated circuits 153 and 154 are arranged on the substrate 151, in this order, toward a longitudinal direction of the substrate 151.

The light emitting portions in orders in odd numbers are connected to the first driver integrated circuit 153 through a conductive strip line 156 by a thin line 157 of gold and the light emitting portions in orders in even numbers are connected to the second driver integrated circuit 154 through a conductive strip line 158 which is formed through an insulating film 155 under the light emitting array 152 and the first driver integrated circuit 153.

The printer head 15 thus structured in the foregoing is attached to the above described holder 44. The light from the exposure lamp 17 is shielded by the holder 44 and hence the image of a document is not focused in a portion opposed to the printer head 15 of the photosensitive drum 13. Meanwhile, in case where all of the document image is desired to be focused on the photosensitive drum 13, the holder 44 is moved to an exterior of the short focusing lens series 14, or the upper end portion of the holder 44 is adapted to be opened and closed, as shown in the Japanese Laying-Open Gazette No. 131564/1985 so that one of the side wall in which the printer head 15 is provided can be rotated with respect to a fulcrum corresponding to a lower end thereof.

The image of document is not focused on the portion opposed to the printer head 15 of the photosensitive drum 13 by the printer head 15 structured in the foregoing, but the image other than the image of the document is formed on the copy sheet 11 by the printer head 15. More particularly, by the printer head 15, a character such as a white "A1" on a black background as shown in FIG. 5A can be formed, or a character such as a black "A1" on a white background can be formed. Usually, if and when a printing is made by a light emitting diode array in a printer and the like, white print is formed only in the portion corresponding to the light emitting portions of the light emitting diodes by a reverse development. However, in an electrophotographic copying machine, a reverse development also reverses white and black of a document image, which causes inconvenience. Accordingly, as shown in FIG. 5A, if and when a white character on a dark background is formed, the light emitting diode array corresponding to such character is made to emit light. However, if and when a usual character is formed, it is necessary to make a light emitting diode array emit light corresponding to the background.

FIGS. 5C and 5D show an example in which patterns other than character are formed in the vicinity of a right end and FIG. 5E shows an example in which alphabet characters are printed.

By the way, as shown in FIG. 2 in the foregoing, since a plurality of members such as the electrification corotron 16 and the developing apparatus 19 are disposed near the periphery of the photosensitive drum 13 of the electronic copying machine in a very close manner, the space where the printer head 15 can be disposed, particularly, the space between the electrification corotron 16 and the developing apparatus 19, is very narrow. In addition, the printer head 15 is required to be disposed such that the aligning direction of the light emitting portions is orthogonal to a rotational direction of the photosensitive drum 13. However, according to a conventional printer head 15, if and when the aligning direction of the light emitting portions is disposed orthogonally to the rotational direction of the photosensitive drum 13, the longitudinal direction of the substrate coincides with the rotational direction of the photosensitive drum 13, and hence it becomes extremely difficult to dispose the printer head 15 in the above described narrow space.

Furthermore, as shown in FIG. 4B in the foregoing, a large scale insulating layer 155 is required between the connecting portion of the light emitting array 152 and the first driver integrated circuit 153, and the connecting portion of the light emitting array 152 and the second driver integrated circuit 154, and hence there are problems that the structure is complicated, efficiency is low, a cost is high and a poor insulation and a breakdown may be caused.

SUMMARY OF THE INVENTION

Accordingly, a primary object of the present invention is to provide a printer head which is extremely miniaturized, which can be disposed in a narrow space of an electrophotographic copying machine and also can be disposed in other serial printer and the like.

Briefly stated, the present invention comprises a printer head in which a plurality of light emitting portions in a light emitting array is aligned and driver circuit units are disposed on an insulating substrate such that a plurality of input and output terminals thereof are aligned in a direction orthogonal to an aligning direction of the light emitting portions.

Accordingly, in accordance with the present invention, an aligning direction of the light emitting portions can be made to coincide with a direction orthogonal to a rotational direction of a photosensitive drum when the printer head is used as a partial printer of an electrophotographic copying machine and thus attachment of the printer head in a narrow space of an electrophotographic copying machine becomes easier and the present printer head can be also used as a printer head for a serial printer and the like. In addition, since conventional large scale multilayer wiring structure is not required, simplification of printer head assemblying process can be achieved.

In accordance with a preferred embodiment of the present invention, a plurality of light emitting portions are aligned in a central portion on one side of a rectangular insulating substrate so as to be parallel with a longitudinal direction of the insulating substrate. First and second groups of lead electrodes are provided extending from the light emitting portions located in orders in odd numbers counted from the one end thereof and the light emitting portions in orders in even numbers, respectively, which extend to opposite directions with respect to each other. On the other side of the insulating substrate, there are disposed driver circuit means having a plurality of input and output terminals, respectively, aligned in a direction orthogonal to the aligning direction of the light emitting portions. The input terminals of the driver circuit means are connected to external connection terminals formed on the other side of the insulating substrate. The input terminals of the driver circuit means are connected to the lead electrodes of the light emitting array through conductive strip lines and resistors formed on the insulating substrate. In addition, a common electrode connected in common to each of the light emitting portions is formed on a rear surface of the light emitting array, the common electrode being connected to the conductive strip lines formed in a central portion on one side of the insulating substrate. The conductive strip line extend to the other side from the central portion on one side of the insulating substrate and are connected to external connection terminals passing through under the driver circuit units.

In addition, according to other embodiment of the present invention, the conductive strip line to which a surface electrode of the light emitting array is connected to the external connection terminals through an edge on one side and the periphery thereof from the central portion on one side of the insulating substrate.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 4A is a plan view of a conventional printer head;

FIG. 4B is a cross sectional view of a conventional printer head;

FIGS. 5A to 5E are plan views showing a copy sheet having images other than a document image formed therein;

DETAILED DESCRIPTION OF THE PREFERRED EMBODIMENTS

Figure 1:
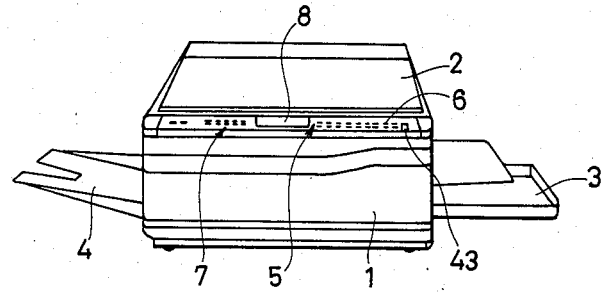
FIG. 1 is a perspective view of an electrophotographic copying machine.
Figure 2:
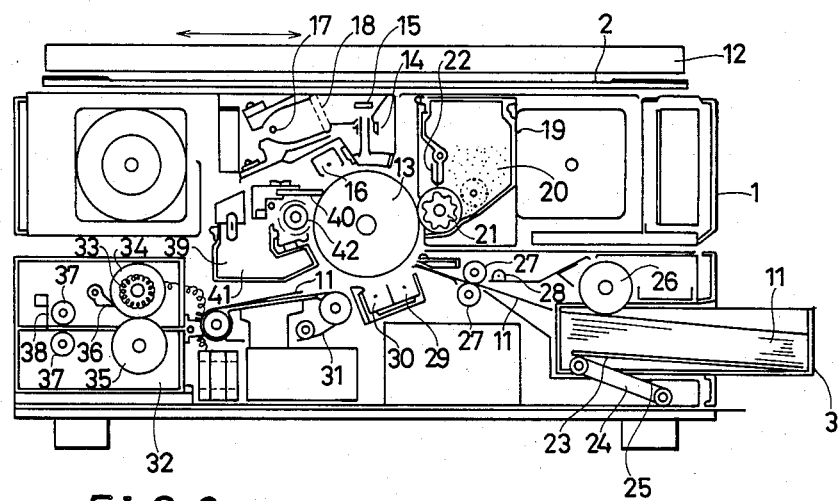
FIG. 2 is a cross sectional view showing an internal structure of an electrophotographic copying machine.
Figure 3:
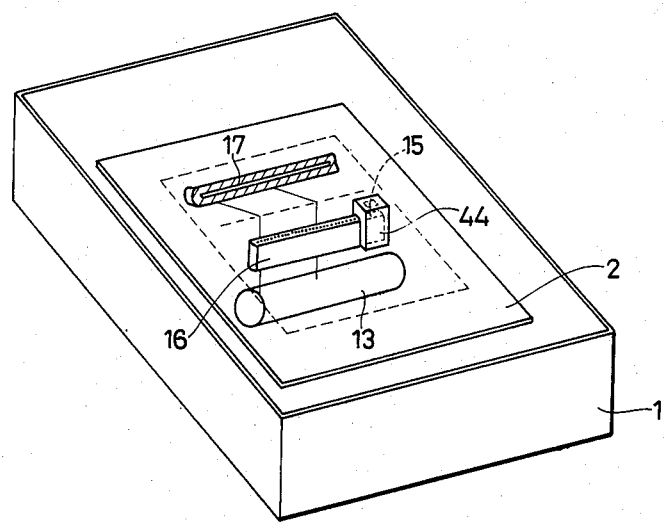
FIG. 3 is a perspective view, partly in cross section, showing a short focusing lens series and a light emitting diode array contained in the electrophotographic copying machine.
Figure 6:
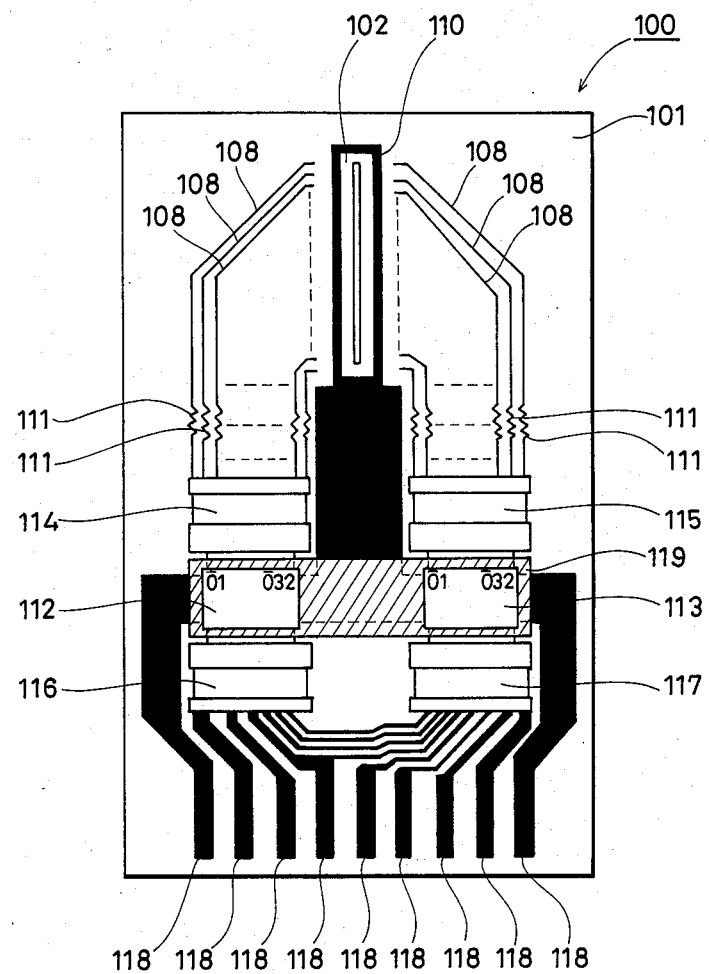
FIG. 6 is a plan view of one embodiment of the present invention.
Figure 7:
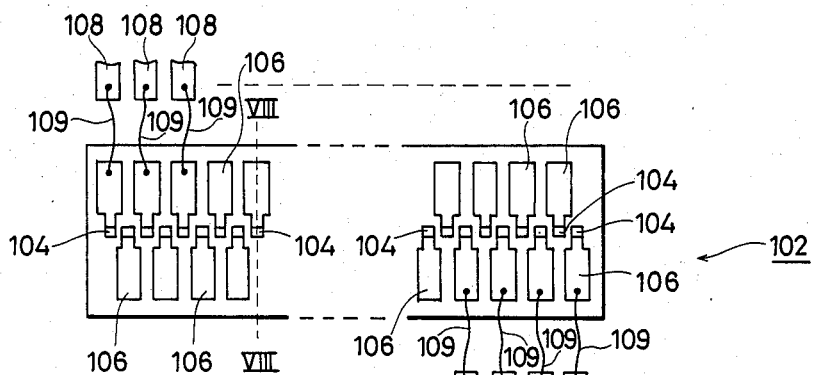
FIG. 7 is an enlarged plan view of essential part of one embodiment of the present invention.
Figure 8:
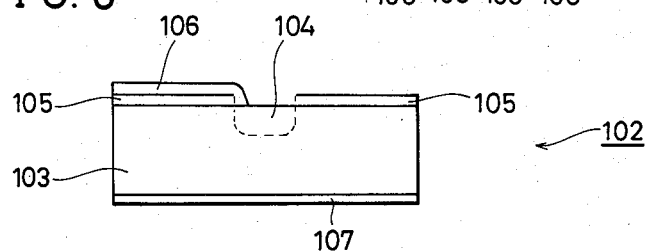
FIG. 8 is a cross sectional view taken along the line VIII—VIII of FIG. 7.

FIG. 6 is a plan view of one embodiment of the present invention, FIG. 7 is an enlarged plan view of essential part of one embodiment of the present invention, and FIG. 8 is a cross sectional view taken along the line VIII—VIII in FIG. 7.

Referring to FIG. 6, an insulation substrate 101 is made of alumina and is structured to be a rectangular configuration having a traverse length of 15 mm and a longitudinal length of 25 mm. A light emitting array 102 including a plurality of (for example, 64) light emitting portions aligned in an array is disposed near the central portion on one side of the insulation substrate 101 such that the aligning direction of the light emitting portions is parallel to the longitudinal direction of the insulation substrate 101.

As shown in FIGS. 7 and 8, the light emitting array 102 includes light emitting portions 104 of p type GaAsP which are formed by selective diffusion of Zn or the like into the surface of an n type GaAsP substrate 103, for example. The light emitting portions 104 are formed in an array on the surface of the substrate 103, with constant spacing. In addition, an insulation film of $SiO_2$, for example, is formed on the surface of the substrate 103 except for the surface of the light emitting portions 104. Lead electrodes 106 making an ohmic contact with the light emitting portions 104 are formed on the insulation film 105. Meanwhile, the lead electrodes 106 extend orthogonally to the aligning direction of the light emitting portions 104 and each of the electrodes 106 making an ohmic contact with neighboring light emitting portions 104 extend to a direction opposite to each other. More particularly, the lead electrodes 106 connected to the light emitting portions located in orders in odd numbers counted from one end of the array 102 extend to one direction and the lead electrodes 106 connected to the light emitting portions located in orders in even numbers extend to other direction opposite to said one direction. An ohmic common electrode 107 is formed on a rear surface of the substrate 103 and the common electrode 107 makes an ohmic contact with each of the light emitting portions 104 commonly.

Referring again to FIG. 6, first conductive strip lines 108, 108 . . . are formed so as to extend to the right and the left from the central portion on one side of the insulation substrate 101, and each of the lead electrodes 106, 106 in the light emitting array 102 is connected to each of the first conductive strip lines 108, 108 . . . by each of golden thin lines 109, 109. . . The common electrode 107 is fixed to a second conductive strip line 110 which is formed in an approximately central portion on one side of the substrate 101. Since all of the electric current for driving the light emitting array 102 flow to the strip line 110, extention of the second conductive strip line 110 is structured such that a wider portion thereof is formed near the central portion of the substrate 101 and the extention branches to the left and right at the middle portion, one of the branching conductive strip lines passing through under a driver circuit unit 112 as described subsequently to extend to other side of the substare 101 along one of longitudinal edges of the substrate 101, so that the strip line is connected to one terminal on the left side of a plurality of external connection terminals 118. On the other hand, the other of the branching conductive strip line passes through under a driver circuit unit 113 as described subsequently to extend to the other end of the substrate 101 along the other longitudinal edge, so that the other of the branching conductive strip line is connected to a terminal on the right side of the external connection terminals 118.

The first conductive strip lines 108 are connected to film resistors 111 formed on the substrate 101. The film resistors 111 are formed to correct variation of light emission. For example, the variation of light emission in the light emitting portions 104 can be corrected by varying the value of the resistor by means of laser trimming and the like. On the other side of the insulation substrate 101, first and second driver circuit units 112 and 113 for driving each of the light emitting portions 104 are disposed. The driver circuit units 112 and 113 comprises integrated circuit elements and may be MSM 6228 made by Oki Electric Industry Company Ltd., for example. The first and second driver circuit units 112 and 113 have respectively, a plurality of input terminals and a plurality of output terminals, respectively, aligned in a direction substantially orthogonal to the aligning direction of the light emitting portions 104 in the light emitting array 102, the inputs terminals and output terminals being fixed onto the branching second conductive strip line 110 through an insulating layer 119 comprised of a resist, for example. Then, the output terminals of the first driver circuit unit 112 are connected to the first conductive strip lines 108 by means of a connector 114 comprised of a conductive rubber, for example, and the input terminals are connected to the external connection terminals 118 by a connector 116. Similarly, the output terminals of the second driver circuit unit 113 are connected to the first conductive strip lines 108 through a connector 115 and the input terminals thereof are connected to the external connection terminals 118 through a connector 117.

Figure 10:
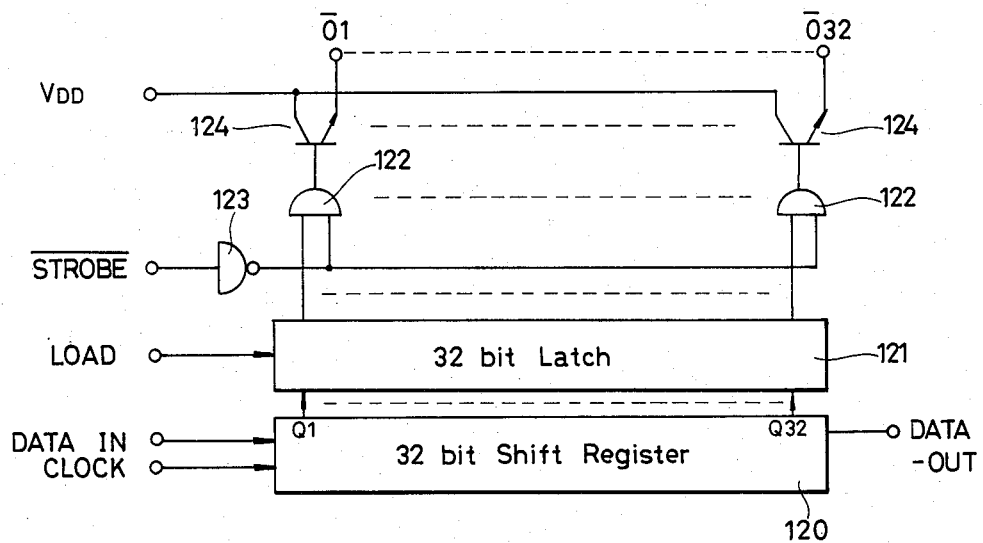
FIG. 10 is an electric circuit of a driver circuit shown in FIG. 9.
Figure 9:
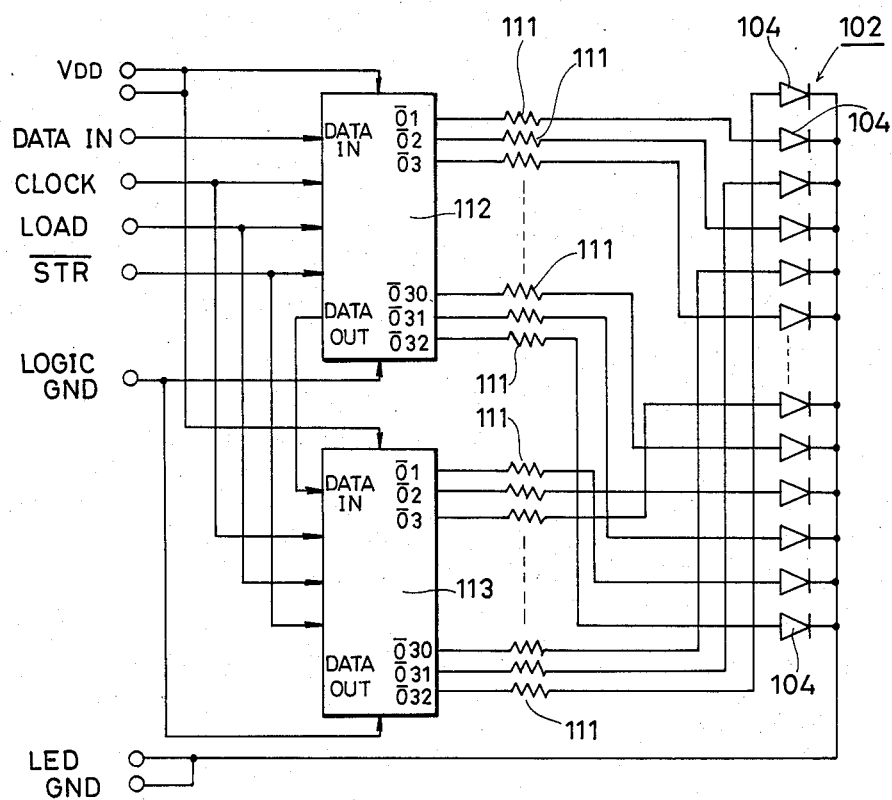
FIG. 9 is an electric circuit of one embodiment of the present invention.

FIG. 9 is an electric circuit of one embodiment of the present invention and FIG. 10 is an electric circuit diagram of a driver circuit unit shown in FIG. 9.

Now, referring to FIGS. 9 and 10, an electric structure of a printer head in accordance with the present invention will be described. An anode of each of the light emitting portions 104, 104 . . . in the light emitting array 102 is connected to one of output terminals $O1$, $O2$ . . . $O32$, $\overline{O1}$, $\overline{O2}$ . . . $\overline{O32}$ of the first and second driver circuit units 112 and 113 through one of resistors 111, 111 . . . (film resistors). DATAOUT terminal of the first driver circuit 112 is connected to DATAIN terminal of the second driver circuit 113 and DATAIN terminal of the first driver circuit 112, VDD terminal, CLOCK terminal, LOAD terminal, $\overline{STROBE}$ terminal and Logic GND terminal of the first and second driver circuits 112 and 113 are connected, respectively, to corresponding external connection terminals 118, 118 . . . 118.

The first and second driver circuit units 112 and 113 include a shift register 120, a latch 121 an AND gate 122 and a transistor 124. The shift register 120 is a shift register of 32 bits having 32 bit outputs. The shift register 120 is responsive to clock signals inputted from the CLOCK terminal to receive serially bit information from the DATAIN terminal and to shift the bit information starting from the first bit toward the thirty-second bit. The latch 121 is comprised of 32 bits, each of the bits corresponding to each of 32 bits of the shift register 120 and reading out and holding the bit information of the shift register 120 when a load signal from the LOAD terminal is applied.

The AND gate 122 has two inputs, one input receiving each bit output from the latch 121 and the other input being connected to $\overline{\text{STROBE}}$ terminal through the inverter 123. Respective output terminals of the AND gate 122 are connected to the respective base terminals of the transistors 124, each of the collector terminals of the transistors 124 being connected to a VDD terminal and each of the emitter terminals being connected to one of the output terminals $\overline{O1}$ through $\overline{O32}$ of the driver circuit units.

Accordingly, in accordance with a printer head of one embodiment of the present invention, the bit information of 64 bits can be received from the DATAIN terminal of the first driver circuit 112 in synchronization with inputs of the clock signals from the CLOCK terminal, so that the bit information can be stored in the respective bits of each of the shift resistors 120 of the first and second driver circuit units 112 and 113. Thereafter, the load signal and strode signal are sequentially inputted from the LOAD terminal and $\overline{\text{STROBE}}$ terminal, so that the bit information stored in each of the shift resistors 112 in the driver circuit units 112 and 113 appears in the form of lighting and non-lighting of the light emitting porions 104.

Figure 11:
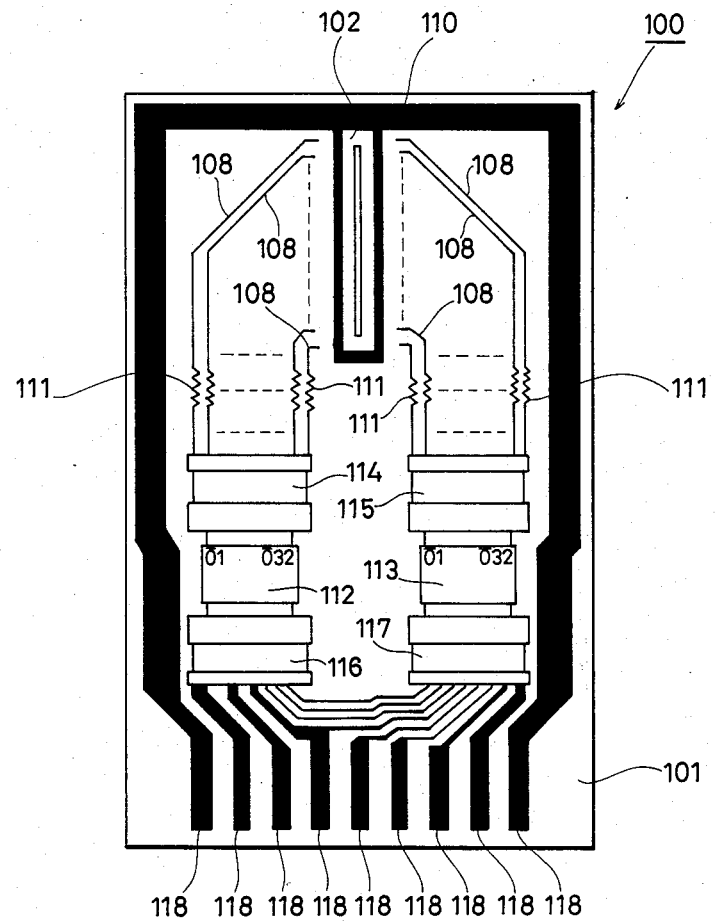
FIG. 11 is a plan view of other embodiment of the present invention.

FIG. 11 is a plan view of other embodiment of the present invention. The embodiment shown in FIG. 11 is the same as the embodiment shown in FIG. 6 except for the following points. More particularly, the second conductive strip line 110 having the light emitting array 102 fixed therein is disposed such that the line 110 branches to the left and right at an approximately central portion on one side of the substrate 101 to extend along the periphery thereof, without passing through under the first and second driver circuit unit 112 and 113, and is connected to the external connection terminals 118 located on the right and left sides. Through the structure as described in the foregoing, it becomes possible to eliminate an insulation layer 119 for insulating the second conductive strip line 110 from the first and second driver circuits 112 and 113 as shown in FIG. 6, so that a simplification of manufacturing steps can be achieved. Meanwhile, the circuits of 32 bits was used for the first and second driver circuits 112 and 113, however, only one circuit of 64 bits may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A printer head comprising:
    an insulation substrate;
    a light emitting array having a plurality of light emitting portions aligned on said insulation substrate; and
    driver circuit means disposed on said insulation substrate for driving said plurality of light emitting portions, said driver circuit means having input and output terminals aligned in a direction orthogonal to the aligning direction of said light emitting portions.

2. A printer head in accordance with claim 1, wherein said light emitting array includes a first group of lead electrodes extending to a first direction from the light emitting portions located in orders in odd numbers counted from one end of the array and a second group of lead electrodes extending to a second direction from the light emitting portions located in orders in even numbers counted from one end of the array, said first and second directions being opposite to each other.

3. A printer head in accordance with claim 1, wherein said insulation substrate is structured to be rectangular, and
    said plurality of light emitting porions are aligned to be parallel with a longitudinal direction of said substrate.

4. A printer head comprising:
    an insulation substrate;
    a light emitting array having a plurality of light emitting portions aligned on said insulation substrate; and
    driver circuit means including integrated circuit elements and having input terminals and output terminals, respectively, aligned on one side of said insulation substrate in a direction orthogonal to the aligning direction of the light emitting portions, each of said output terminals being connected to one of said plurality of light emitting portions.

5. A printer head in accordance with claim 4, wherein said light emitting array includes a first group of lead electrodes extending in a first direction from the light emitting portions located in orders in odd numbers counted from the one end of the array and a second group of lead electrodes extending in a second direction from the light emitting portions in orders in even numbers counted from the one end of the array, said second direction being opposite to said first direction.

6. A printer head in accordance with claim 5, wherein said insulation substrate is structured to be rectangular, and
    said plurality of light emitting portions are aligned to be parallel to the longitudinal direction of the substrate.

7. A printer head in accordance with claim 6, which further comprises
    conductive strip lines formed on said insulation substrate for connecting said first and second groups of lead electrodes of said light emitting portions and the output terminals of said driver circuit units.

8. A printer head comprising:
    a rectangular insulation substrate;
    a light emitting array including a plurality of light emitting portions aligned on a side of a semiconductive substrate in an approximately central portion on one side of said insulation substrate and aligned in a direction parallel to a longitudinal direction of said insulation substrate, common electrode formed on a rear surface of said semiconductive substrate and commonly connected to said plurality of light emitting portions and lead electrodes each connected to the respective one of said plurality of light emitting portions, said lead electrodes including a first group of electrodes extending in a first direction from the light emitting portions located in orders in odd numbers counted from the one end of the array and a second group of lead electrodes extending in a second direction from the light emitting portions in orders in even numbers counted form the one end of the array, said second direction being opposite to the first direction;

driver circuit means disposed on the other side of said insulation substrate for driving said light emitting portions, said driver circuit means having a plurality of input terminals and a plurality of output terminals aligned, respectively, in a direction orthogonal to the aligning direction of said plurality of light emitting portions;

a plurality of external connection terminals formed on the said other side of said insulation substrate, any of said plurality of external connection terminals being connected to one of said input terminals of said driver circuit means;

a plurality of first conductive strip lines formed on said insulation substrate for connecting said output terminals of said driver circuit means to said lead electrodes of said plurality of light emitting portions; and a second conductive strip line formed on said insulation substrate, one end of the second conductive strip line being connected to the common electrode of the light emitting array and extending toward said other side in a central portion of said insulation substrate passing through the underside of said driver circuit means, so that the other end of said second conductive strip line can be connected to any of said external connection terminals.

9. A printer head in accordance with claim 8, which further comprises resistive elements inserted in said first conductive strip lines, so that predetermined current flows through said light emitting portions.

10. A printer head in accordance with claim 8, which further comprises insulation film formed between said driver circuit means and a portion of said second conductive strip line passing through the underside of said driver circuit means.

11. A printer head in accordance with claim 8, which further comprises
   first connecting members for connecting said external lead terminals to the input terminals of said driver circuit means; and
   second connecting members for connecting the output terminals of said driver circuit means to one end of said first conductive strip lines.

12. A printer head in accordance with claim 8, wherein
   said driver circuit means includes a first driver circuit unit for driving the light emitting portions located in orders in odd numbers and a second driver circuit unit for driving the light emitting portions located in even orders in even numbers,
   said second conductive strip line branches near the central portion of said substrate, one of said branching conductive strip lines passing through the underside of said first driver circuit unit to extend to said other end along one of longitudinal edges of said insulation substrate and the other of the branching conductive strip lines passing through the underside of said second driver circuit unit to extend to said other end along the other of the longitudinal edges of said insulation substrate.

13. A printer head comprising:
a rectangular insulation substrate;
a light emitting array including a plurality of light emitting portions aligned on a side of a semiconductive substrate near a central portion on one side of said insulation substrate and aligned in a direction parallel to a longitudinal direction of said insulation substrate, a common electrode formed on a rear surface of the substrate and commonly connected to said plurality of light emitting portions, and lead electrodes each connected to a corresponding one of said plurality of light emitting portions, said lead electrodes comprising a first group of lead electrodes extending in a first direction from the light emitting portions located in orders in odd numbers counted from the one end thereof and a second group of lead electrodes extending in a second direction from the light emitting portions located in orders in even numbers counted from the one end thereof, said second direction being opposite to the first direction;

driving circuit means disposed on the other side of said insulation substrate and including integrated circuit elements for driving said light emitting portions, said driver circuit means having a plurality of input terminals and a plurality of output terminals, respectively, aligned in a direction orthogonal to the aligning direction of said plurality of light emitting portions;

a plurality of internal connection terminals formed on the surface in the other side of said insulation substrate, any of said external connection terminals being connected to one of the input terminals of said driver circuit and;

a plurality of first conductive strip lines formed on said insulation substrate for connecting said output terminals of said driver circuit means to said lead electrodes of said plurality of light emitting portions; and a second conductive strip line formed on said insulation substrate, one end of the second strip line being connected to the common electrode of said light emitting array and extending to the other end along the periphery of said insulation substrate, the other end of the second strip line being connected to any of said external connection terminals.

14. A printer head in accordance with claim 13, which further comprises
   resistive elements inserted in said first conductive strip lines, so that a constant current flows into said light emitting portions.

15. A printer head in accordance with claim 13, which further comprises
   first connecting members for connecting said external lead terminals to said input terminals of said driver circuit means, and
   second connecting members for connecting said output terminals of said driver circuit means to one end of said first conductive strip line.

16. A printer head in accordance with claim 13, wherein
   said driver circuit means includes a first driver circuit unit for driving the light emitting portions located in orders in odd numbers and second driver circuit unit for driving the light emitting portions located in orders in even numbers.

* * * * *